US006444082B1

(12) United States Patent
Campbell et al.

(10) Patent No.: US 6,444,082 B1
(45) Date of Patent: Sep. 3, 2002

(54) APPARATUS AND METHOD FOR REMOVING A BONDED LID FROM A SUBSTRATE

(75) Inventors: Barrie C. Campbell, Endwell; David L. Edwards, Poughkeepsie; Ronald L. Hering, Pleasant Valley; Richard F. Shortt, Poughquag, all of NY (US)

(73) Assignee: International Business Machines Corporation, Armonk, NY (US)

( * ) Notice: Subject to any disclaimer, the term of this patent is extended or adjusted under 35 U.S.C. 154(b) by 203 days.

(21) Appl. No.: 09/599,754

(22) Filed: Jun. 22, 2000

(51) Int. Cl.[7] .............................................. B32B 35/00
(52) U.S. Cl. ....................... 156/344; 156/584; 29/426.5; 29/762
(58) Field of Search ................................ 156/344, 584; 29/221.6, 402.03, 426.5, 426.6, 762

(56) References Cited

U.S. PATENT DOCUMENTS

| 1,459,693 | A | * | 6/1923 | Rand et al. ................. 156/344 |
| 4,016,639 | A | * | 4/1977 | Dombrowski et al. ........ 269/52 |
| 4,685,991 | A | * | 8/1987 | Herrmann et al. ........... 156/344 |
| 4,783,893 | A | * | 11/1988 | Farino ........................ 29/426.5 |
| 4,828,640 | A | * | 5/1989 | Kaya et al. ................. 156/160 |
| 5,335,892 | A |   | 8/1994 | Busch |
| 5,367,762 | A | * | 11/1994 | Disko et al. ................ 29/426.4 |
| 5,375,319 | A |   | 12/1994 | Jacobs |
| 5,423,931 | A | * | 6/1995 | Inoue et al. ................ 156/344 |
| 5,432,318 | A |   | 7/1995 | Minahan |
| 5,505,433 | A |   | 4/1996 | Carmichael et al. |
| 5,545,282 | A | * | 8/1996 | Bechmann .................. 156/248 |
| 5,564,176 | A | * | 10/1996 | Garcia et al. ................ 29/235 |
| 5,782,403 | A | * | 7/1998 | Wang ........................... 228/19 |
| 5,837,556 | A |   | 11/1998 | Ostendorf et al. |
| 5,839,181 | A | * | 11/1998 | Chu ........................... 29/281.5 |
| 5,868,297 | A |   | 2/1999 | Zabel et al. |
| 6,068,727 | A | * | 5/2000 | Weaver et al. ............. 156/344 |
| 6,249,960 | B1 | * | 6/2001 | Faesel ........................ 29/750 |

OTHER PUBLICATIONS

IBM Technical Disclosure Bulleting, vol. 33. No. 10A, Mar. 1991 entitled "IC Socket With IC Removal Mechanism" pp. 326 and 327.

* cited by examiner

Primary Examiner—Mark A. Osele
(74) Attorney, Agent, or Firm—James J. Cioffi; Ira D. Blecker

(57) ABSTRACT

An apparatus and a method for removing a bonded lid from a substrate of variable size including nesting jaws to support and secure the substrate; and gripping jaws to grip the lid; wherein, in operation, the gripping jaws pivot with respect to the nesting jaws and create a, peeling action which separates the lid from the substrate with minimum force and without damage to the substrate or attached semiconductor devices.

29 Claims, 5 Drawing Sheets

APPARATUS AND METHOD FOR REMOVING A BONDED LID FROM A SUBSTRATE

BACKGROUND OF THE INVENTION

The present invention is directed to electronic packaging and, more particularly, is directed to an apparatus and method for removing a bonded lid from a substrate. Electronic packages typically utilize a multilayer ceramic substrate. Semiconductor chips and devices are attached to conductive metal pads on the substrate. These pads are connected to conductive wiring channels which are distributed throughout the layers comprising the substrate. The wiring connects the semiconductor chips and devices on the top surface of the substrate with metal pads on the bottom surface of the substrate which supply the I/O (input/output) connection to the system board. Electronic packages are often sealed with lids which are bonded to the substrate using adhesives. The lids provide a variety of purposes. They can provide a sealed environment for the semiconductor devices attached to the substrate, prevent physical damage to the semiconductor devices from handling and transportation, and may be a necessary component to the thermal characteristics of the electronic package. Although the lid attach process has high yield, high volume products still have a yield loss due to lid attach or seal defects which cannot be reworked easily. The high strength of the adhesive makes it difficult to separate lids from substrates once they are bonded together. Often there are no physical features on the lid which would allow one to grip it for separation. Another problem is avoiding damage to the substrate or the semiconductor devices attached to the substrate during separation of the lid from the substrate.

There are a number of solutions proposed by others for separating adhesively bonded components. Carmichael et al. U.S. Pat. No. 5,505,433, the disclosure of which is incorporated by reference herein, discloses an apparatus and method for removing a sheet of material anchored to the floor. The invention requires surface area and features not available in an electronic packaging application, and creates a high concentration of stress which would expose the substrate to damage from excessive bending moments.

Busch, U.S. Pat. No. 5,335,892, the disclosure of which is incorporated by reference herein, discloses a removable adhesively mounted retention plate and Ostendorf et al. U.S. Pat. No. 5,837,556, the disclosure of which is incorporated by reference herein, discloses a method of removing a component bonded to a substrate utilizing a push pin to contact the component and force the component away from the substrate. These inventions create high concentrations of stress which would expose the substrate to damage from excessive bending moments.

Jacobs, U.S. Pat. No. 5,375,319, the disclosure of which is incorporated by reference herein, discloses a removal tool for removing a component bonded to a printed wiring board. A torque handle assembly is coupled to a jaw assembly that is rotatable to apply torque to the component to break the bond between the component and the printed wiring board. Minahan, U.S. Pat. No. 5,432,318, the disclosure of which is incorporated by reference herein, discloses an apparatus that uses shear force for segmenting a stack of bonded IC chips into shorter stacks. Both inventions could expose semiconductor devices attached to a substrate to damage from the lateral or rotational movement of the lid.

Zabel et al. U.S. Pat. No. 5,868,297, the disclosure of which is incorporated by reference herein, discloses a device for separating components from a substrate using leverage and heat. The invention does not offer a method to grasp the lid and uses straight tensile force which would result in excessive force to the substrate. Also, the application of heat is undesirable in an electronic packaging application.

Notwithstanding the prior art solutions to the problem, there remains a need for an apparatus and method to separate a bonded lid from substrates of variable size without damaging the substrate or semiconductor devices attached to the substrate.

Accordingly, it is a purpose of the present invention to have an apparatus and method to separate a bonded lid from substrates of variable size without damaging the substrate or semiconductor devices attached to the substrate.

It is another purpose of the present invention to have an apparatus and method to separate a bonded lid from a substrate in which heat is not used.

The present inventors have proposed an apparatus and a method which fulfills the purposes of the present invention by utilizing a set of variable size, high pressure jaws that have the capability of grasping vertical surfaces of the lid firmly and variable size nesting jaws which provide support of the substrate. A mechanical advantage is provided to place the adhesive seal in tension and create a peeling action which separates the lid from the substrate with minimum force and without damage to the substrate or attached semiconductor devices.

These and other purposes of the present invention will become more apparent after referring to the following description considered in conjunction with the accompanying drawings.

BRIEF SUMMARY OF THE INVENTION

The purposes and advantages of the present invention have been achieved by providing, according to a first aspect of the invention an apparatus for separating a bonded lid from a substrate, comprising;

a first set of jaws for holding the substrate;

a second set of jaws for gripping a lid bonded to the substrate; and means for pivoting said second set of jaws with respect to said first set of jaws so as to separate the lid from the substrate.

According to a second aspect of the invention, there is provided an apparatus for separating a bonded lid from a substrate, comprising;

a first set of jaws for holding the substrate;

means for gripping the lid;

means for pivoting the means for gripping the lid.

According to a third aspect of the invention, there is provided a method of separating a bonded lid from a substrate comprising the steps of:

providing an apparatus comprising a first set of jaws for holding the substrate and a set of jaws for gripping a lid bonded to the substrate;

placing the substrate with the bonded lid in said apparatus; and pivoting said second set of jaws with respect to said first set of jaws so as to separate the lid from the substrate.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

The purposes of the present invention have been achieved by providing, according to the present invention, an apparatus and method for removing a lid bonded to a substrate. Briefly, the present invention provides for nesting jaws which support and secure the substrate while gripping jaws grip the lid. In operation, the gripping jaws pivot with respect to the substrate to thereby "peel" the lid from the substrate as will be explained in more detail hereafter.

Figure 1:
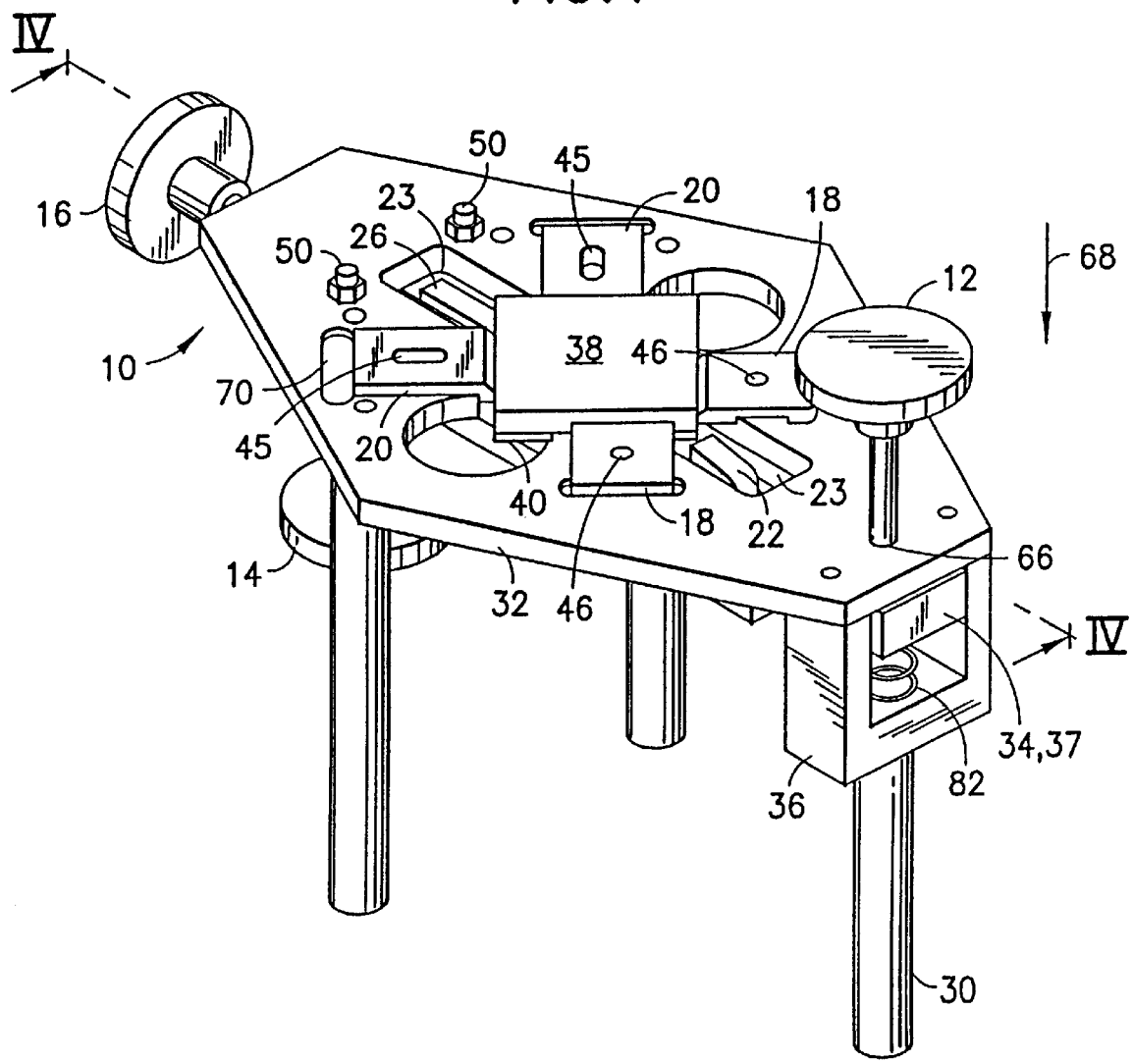
FIG. 1 is a perspective view of the apparatus for separating a bonded lid from a substrate.

Referring to the figures in more detail, and particularly referring to FIG. 1, there is shown the lid separation apparatus 10 according to the present invention. The lid separation apparatus 10 consists of a top support frame 32 supported by legs 30. Two fixed nesting jaws 18 and two movable nesting jaws 20 are located in recessed areas 70 on the top support frame 32 and secured to the top support frame 32 with retaining screws 46. The two fixed nesting jaws 18 and two movable nesting jaws 20 are positioned on the top support frame 32 adjacent to each edge of the substrate 38 to form a nest to support and secure a substrate 38. As will be explained in more detail hereafter the two movable nesting jaws 20 are free to move in a linear distance determined by the size of the recess area 70 in the top support frame 32. A retaining screw 46 (not shown) located in a slot 45 is used to fix the movable nesting jaws 20 in the desired positions thereby providing the capability of accommodating substrates 38 of variable size. While the present invention as shown in FIG. 1 shows two fixed nesting jaws 18 and two movable nesting jaws 20, it is within the scope of the present invention for all four nesting jaws to be movable to thereby accommodate rectangular substrates in addition to the square substrate 38 shown in FIG. 1.

Figure 2:
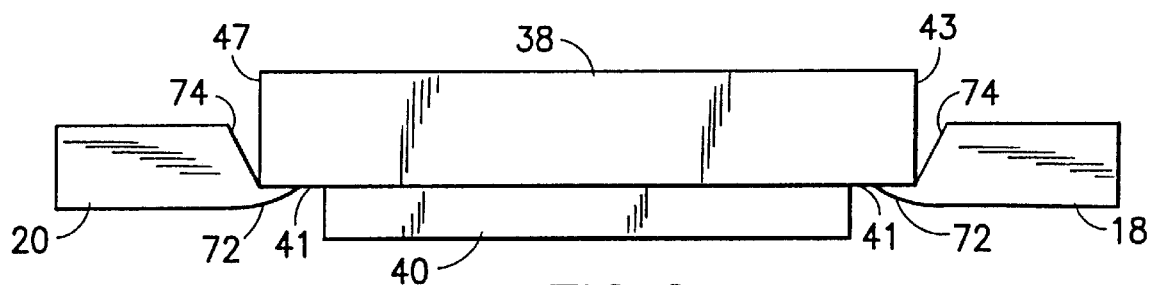
FIG. 2 is a schematical view of a first set of jaws for holding a substrate.

Referring now to FIG. 2, there is shown a more detailed view of one of the fixed nesting jaws 18 and one of the movable nesting jaws 20 to illustrate their cooperation in supporting the substrate 38. The edge of the fixed nesting jaw 18 and the edge of the movable nesting jaw 20 adjacent and parallel to the edges of the substrate 38 have a protruding lip 72 at the base of the jaw which provides a seating surface for the substrate 38. The other fixed nesting jaw 18 and movable nesting jaw 20 not shown operate similarly on substrate 38. Considering the square substrate 38 shown here, the substrate 38 is positioned with its top side down, i.e., lid 40 faces down, onto the two fixed nesting jaws 18 which support the substrate 38 along its top surface perimeter 41 by resting on the protruding lip 72 of the two fixed nesting jaws 18. The vertical sides 43 of the substrate 38 are also positioned in contact with the vertical edge 74 of the two fixed nesting jaws 18. The two movable nesting jaws 20 are then moved into contact with the substrate 38 and the protruding lip 72 of the two moveable nesting jaws 20 support the substrate 38 also along its top surface perimeter 41 and the vertical sides 47 of the substrate 38 are contacted by the adjacent vertical edge 74 of the two movable nesting jaws 20. The substrate 38 is thereby supported along its top surface perimeter 41 and secured in place about its vertical sides 43,47.

Referring again to FIG. 1, a pivotable gripping jaw 22 and a movable gripping jaw 26 are positioned in clearance slots 23 in the top support frame 32 to contact opposite diagonal corners of the lid 40. A coarse jaw adjust member 16, shown here as a screw, is positioned to engage and advance the movable gripping jaw 26 and the pivotable gripping jaw 22 into contact with opposite diagonal corners of the lid 40. A jaw actuator member 14, shown here as a screw, is positioned to pivot the pivotable gripping jaw 22 with a resulting mechanical advantage to apply a secure grip on the lid 40. A jacking member 12, shown here as a screw, is positioned to pivot the pivotable gripping jaw 22 and the movable gripping jaw 26 downward with respect to the fixed substrate 38 resulting in the separation of the lid 40 by a peeling action. The arrangement and operation of gripping jaws 22, 26, coarse jaw adjust member 16, jaw actuator member 14 and jacking member 12 will be described in more detail hereafter with reference to FIGS. 3, 4, 5 and 6.

Figure 3:
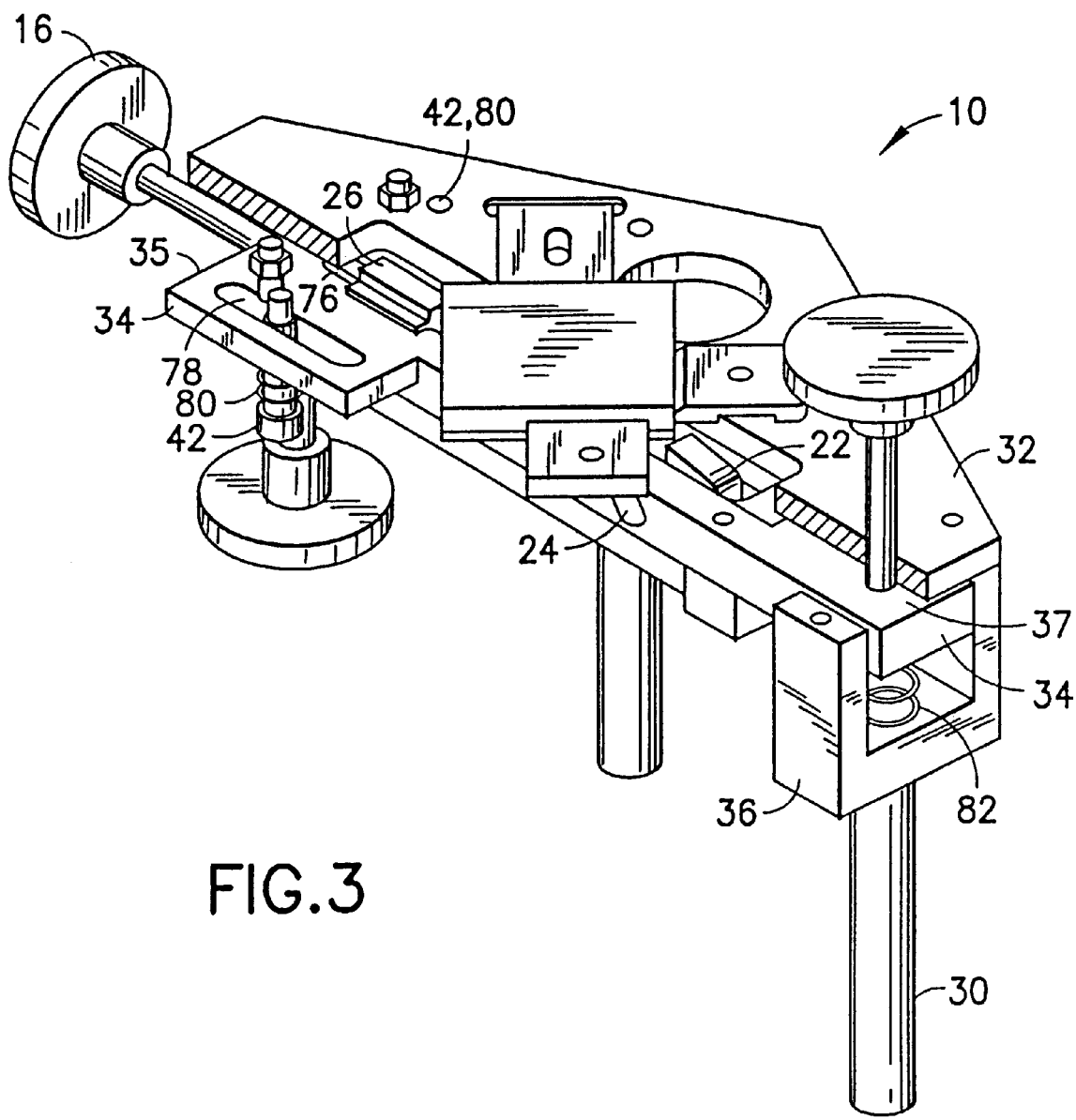
FIG. 3 is a perspective view of the apparatus with a section of the top support frame removed to show in more detail the "T" shaped support member underneath.
Figure 6:
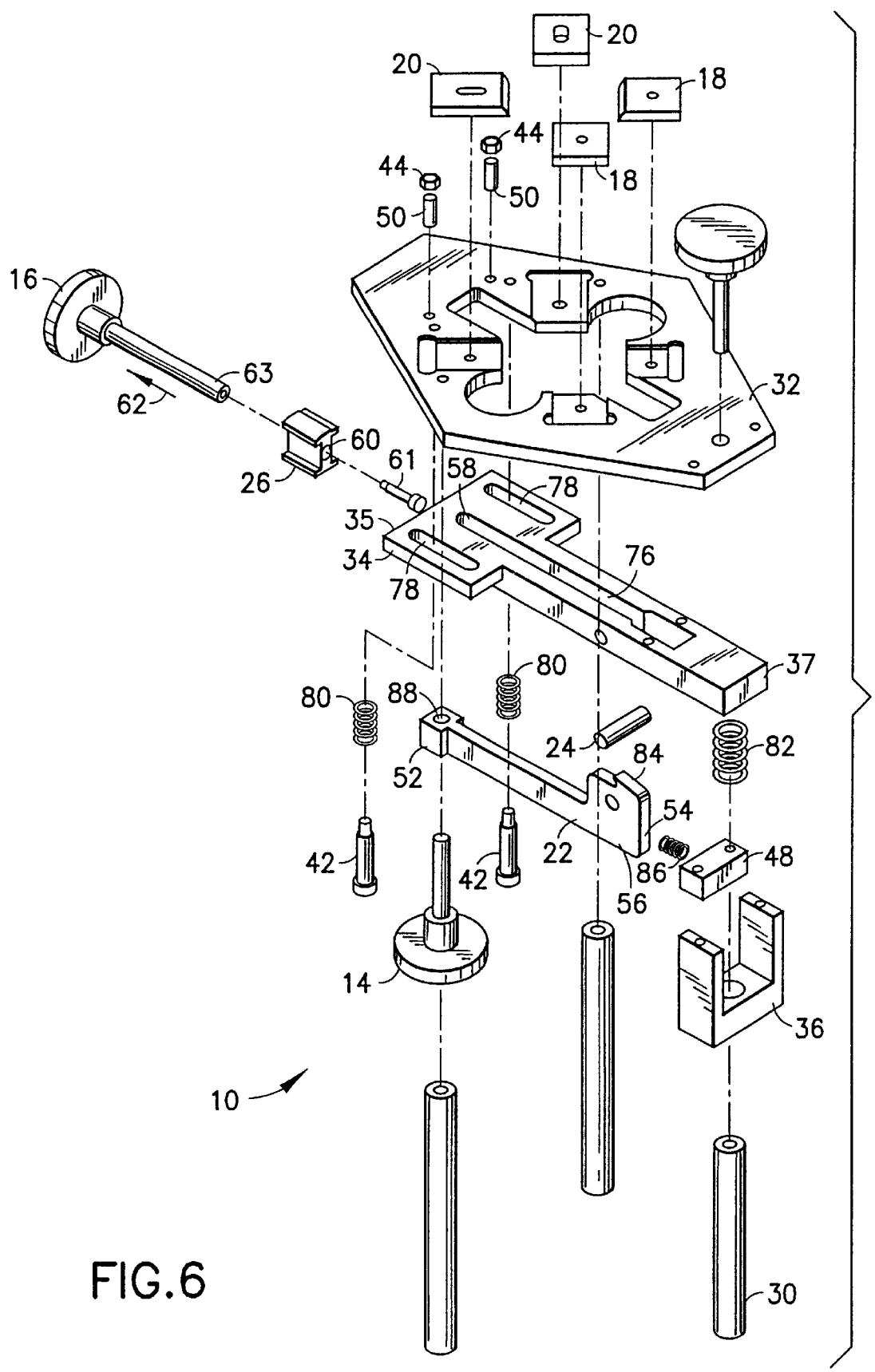
FIG. 6 is an exploded view of the apparatus according to the present invention.

Referring now to FIG. 3 and FIG. 6, there is disclosed, according to the present invention, a more detailed view of the lid separation apparatus 10. The lid separation apparatus 10 includes a "T" shaped support member 34. The "T" shaped support member 34 contains one long longitudinal clearance slot 76 and two shorter clearance slots 78 at its short end. The "T" shaped support member 34 is attached to the top support frame 32 by a pair of shoulder screws 42 positioned through each of the two shorter clearance slots 78 at the short end 35 of the "T" shaped support member 34. The short end 35 of the "T" shaped support member 34 rests on two springs 80 positioned on the shoulder screws 42. The "T" shaped support member 34 also rests on a spring 82 at its long end 37. The spring 82 is contained in a "U" shaped bracket 36 connected to the top support frame 32 and supported by a leg 30. The movable gripping jaw 26 is captured in, and can slide along, the longitudinal clearance slot 76 in the "T" shaped support member 34. The moveable gripping jaw 26 has protruding lips which engage the top and bottom of the longitudinal clearance slot 76 in the "T" shaped support member 34. The pivotable gripping jaw 22 is an "L" shaped member attached to the "T" shaped support member 34 by a pivot pin 24 and is free to pivot in the longitudinal clearance slot 76 in the "T" shaped support member 34. The coarse jaw adjust member 16 passes through a threaded hole in the "T" shaped support member 34 to engage the movable gripping jaw 26.

Figure 4:
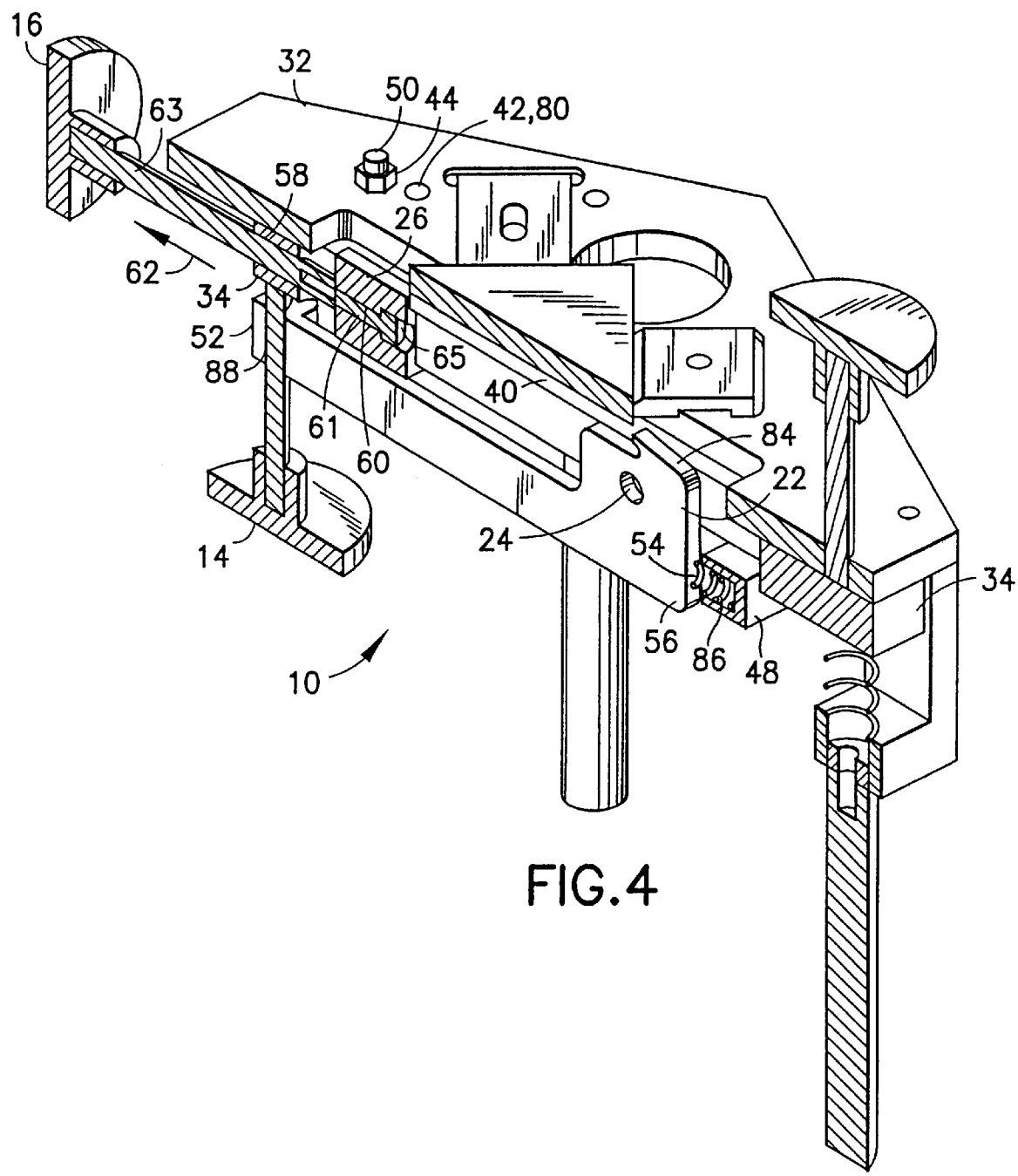
FIG. 4 is a perspective view of the apparatus sectioned in the direction of arrows IV—IV of FIG. 1 to show in more detail a second set of jaws for gripping a lid bonded to the substrate.

Referring now to FIG. 4 and FIG. 6, there is disclosed, according to the present invention, a more detailed view of the gripping jaws 22, 26 in apparatus 10. The pivotable gripping jaw 22 has a gripping portion 84 which pivots about pivot pin 24. The jaw actuator member 14 engages the long end 52 of the pivotable gripping jaw 22 through a threaded hole 88 at the long end of the pivotable gripping jaw 22. A spring 86 in an insert 48 connected to the "T" shaped support member 34 contacts the pivotable gripping jaw 22 at 54 and provides a force perpendicular to the short end 56 of the pivotable gripping jaw 22 to seat the pivotable gripping jaw 22 when not engaged at its long end by the jaw actuator member 14. A pair of set screws 50 engaged by a pair of locking nuts 44 pass through a pair of threaded holes in the top support frame 32 and contact the "T" shaped support member 34. The set screws 50 can be turned to adjust the vertical height of the "T" shaped support member 34, with respect to the top support frame 32, which is free to move in the vertical direction due to compression of the springs 80 positioned on the shoulder screws 42 (as shown in FIG. 3), thereby adjusting the vertical height of the movable gripping jaw 26. This provides the capability to align the vertical position of the movable gripping jaw 26 with the corner of the lid 40.

The coarse jaw adjust member 16 passes through a threaded hole 58 in the "T" shaped support member 34 to engage a shoulder screw 61 in hole 60 in the movable gripping jaw 26. Shoulder screw 61 is threaded into the coarse jaw adjust member 63 while the head 65 of the shoulder screw 61 is within moveable gripping jaw 26. The arrangement of the coarse jaw adjust member screw 63 and the shoulder screw 61 with respect to the moveable gripping jaw 26 allows the coarse jaw adjust member 16 to both advance and retract the moveable gripping jaw 26. The coarse jaw adjust member 16 is advanced to engage and advance the movable gripping jaw 26 into contact with one corner of the lid 40. Contact of the movable gripping jaw 26 with a corner of the secured, and now fixed, lid 40 causes the coarse jaw adjust member 16 to engage the "T" shaped support member 34 about the threaded hole 58 and advance the "T" shaped support member 34 in the direction indicated by arrow 62, thereby also advancing the pivotable gripping jaw 22, attached to the "T" shaped support member 34 by pivot pin 24 in the same direction 62 into contact with an opposite diagonal corner of the lid 40. The jaw actuator member 14 is turned to contact the top support frame 32 thereby engaging the threaded clearance hole 88 in the pivotable gripping jaws 22 long end 52 and causing the long end 52 to move down causing the pivotable gripping jaws 22 short end 56 to pivot about pivot pin 24 with a resulting mechanical advantage causing the pivotable gripping jaw 22 to impart a large force on lid 40. This causes the lid 40 to be engaged on opposite diagonal corners by the movable gripping jaw 26 and the pivotable gripping jaw 22 with sufficient force to deform the opposite diagonal corners of the lid 40 resulting in a secure grip.

Figure 5:
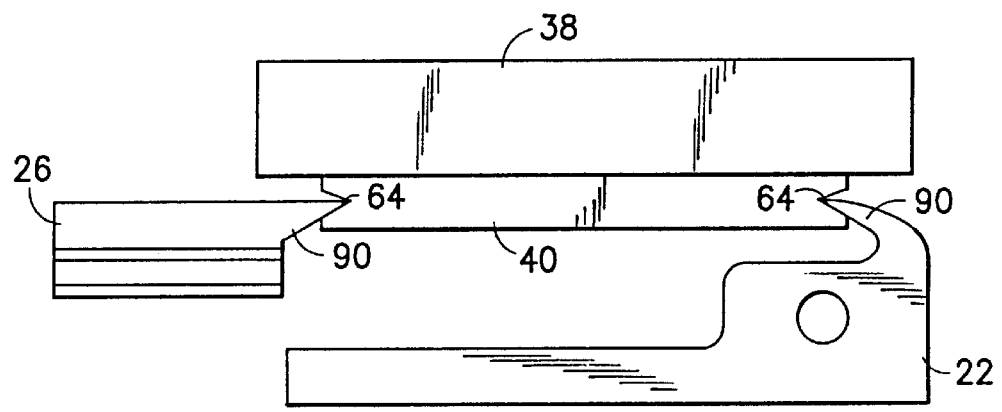
FIG. 5 is a schematical view of a second set of jaws for gripping a lid bonded to a substrate.

Referring now to FIG. 5, there is disclosed, according to the present invention, a more detailed view of the gripping jaws 22, 26 securing the lid 40. The edge of the pivotable gripping jaw 22 and the edge of the movable gripping jaw 26 adjacent to the diagonal corners of the lid 40 have a protruding lip 90 at the top of the jaw which engages the corner of the lid 40 with a knife edge which deforms 64 the corner of the lid 40 resulting in a secure grip.

Referring again to FIG. 1, in operation of the lid separation apparatus 10, the substrate 38 is placed lid 40 down into contact with the two fixed nesting jaws 18 and the two movable nesting jaws 20 are then moved to contact and secure the substrate 38. The set screws 50 are adjusted to align the vertical position of the movable gripping jaw 26 with a corner of the lid 40. The coarse jaw adjust member 16 is advanced to engage the opposite diagonal corners of the lid 40 between the movable gripping jaw 26 and the pivotable gripping jaw 22. The jaw actuator member 14 is then turned to pivot the pivotable gripping jaw 22 with a resulting mechanical advantage to supply a large gripping force securing the lid 40 on opposite diagonal corners between the movable gripping jaw 26 and the pivotable gripping jaw 22. The jacking member 12 is threaded through a hole 66 in the top support frame 32 to engage the long end 37 of the "T" shaped support member 34 positioned on a spring 82 in the "U" bracket 36. Advancing the jacking member 12 downward indicated by arrow 68 causes the long end 37 of the "T" shaped support member 34 to compress the spring 82 and move downward, pivoting with respect to the short opposite end 35 of the "T" shaped support member 34. The downward movement 68 of the "T" shaped support member 34 causes both the movable gripping jaw 26 and the pivotable gripping jaw 22 to be displaced downward in direction 68, however, the pivoting action of the "T" shaped support member 34 causes the pivotable gripping jaw 22 to be displaced downward a greater distance then the movable gripping jaw 26. This causes a greater downward force to be applied to the corner of the lid 40 engaged by the pivotable gripping jaw 22 which results in a peeling force to be exerted on this corner of the lid 40 engaged by the pivotable gripping jaw 22 which in turn initiates the separation of the lid 40 from the substrate 38 with minimum force and without an accompanying lateral or rotational movement of the lid 40 thereby preventing damage to the attached components underneath the lid 40.

As noted previously, gripping jaw 22 was described as "L" shaped. It is within the scope of the present invention for gripping jaw 22 to have a different shape so long as it pivots to securely grip the corner of the lid 40. As also noted previously, jacking member 12, jaw actuator member 14 and coarse jaw adjust member 16 were all described as being screws. It is within the scope of the present invention for these members to comprise other means for applying the necessary forces. Such other means may comprise, for example, mechanical, hydraulic, pneumatic or electrical devices, such as springs, levers, cams, actuators or solenoids.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. Apparatus for separating a bonded lid from a substrate, comprising;

a first set of jaws for holding the substrate;

a second set of jaws for gripping a lid bonded to the substrate, said second set of jaws for gripping comprising a movable slide jaw and a pivotable jaw, said pivotable jaw having a protruding lip ending in a sharp edge which is so positioned as to engage a corner of the lid; and means for pivoting said second set of jaws with respect to said first set of jaws so as to separate the lid from the substrate.

2. The apparatus as recited in claim 1 wherein each jaw of said first set of jaws has a protruding lip.

3. The apparatus as recited in claim 2, wherein said first set of jaws are positioned adjacent to each edge of the substrate and support the substrate with the protruding lip.

4. The apparatus as recited in claim 3, wherein at least one jaw in said first set of jaws is secured in place with a retaining screw positioned in a clearance slot in said at least one jaw, said at least one jaw being slideably moveable over the length of said clearance slot thereby allowing said first set of jaws to secure substrates of variable size.

5. The apparatus as recited in claim 4, wherein said first set of jaws comprises four jaws of which two jaws are moveable and two jaws are fixed.

6. The apparatus as recited in claim 4, wherein said first set of jaws comprises four jaws of which all four jaws are moveable.

7. The apparatus as recited in claim 1, wherein said movable slide jaw has a protruding lip ending in a sharp edge which is so positioned as to engage a corner of the lid.

8. The apparatus as recited in claim 7, wherein said movable slide jaw is positioned with a coarse jaw adjust member to contact and advance said movable slide jaw into contact with a corner of the lid and advance the pivotable jaw into contact with the lid on the lid's opposite diagonal corner.

9. The apparatus as recited in claim 1, wherein said pivotable jaw pivots around a pivot point and has an end opposite from the protruding lip, the end engaged by a jaw actuator member.

10. The apparatus as recited in claim 1, wherein said pivotable jaw is an "L" shaped member pivoted at its short end and engaged by a jaw actuator member at its long end.

11. The apparatus as recited in claim 1, the means for pivoting said second set of jaws with respect to said first set of jaws so as to separate the lid from the substrate comprises a jacking member in communication with said second set of jaws which causes said second set of jaws to pivot with respect to said first set of jaws resulting in a peeling force which initiates the separation of the lid from the substrate.

12. The apparatus as recited in claim 1 further comprising a frame for holding said first set of jaws, said second set of jaws and said means for pivoting said second set of jaws.

13. Apparatus for separating a bonded lid from a substrate, comprising;
    a first set of jaws for holding the substrate;
    means for gripping the lid, said means for gripping the lid comprising a jaw actuator member and a second set of jaws, the jaw actuator member forcing the second set of jaws to engage the lid, said second set of jaws comprising a movable slide jaw and a pivotable jaw, said pivotable jaw having a protruding lip ending in a sharp edge which is so positioned as to engage a corner of the lid; and
    means for pivoting the means for gripping the lid.

14. The apparatus as recited in claim 13, wherein said movable slide jaw has a protruding lip ending in a sharp edge which is so positioned as to engage a corner of the lid.

15. The apparatus as recited in claim 14, wherein said movable slide jaw is positioned with a coarse jaw adjust member to contact and advance said movable slide jaw into contact with a corner of the lid.

16. The apparatus as recited in claim 13, wherein said pivotable jaw pivots around a pivot point and has an end opposite from the protruding lip, the end engaged by a jaw actuator member.

17. The apparatus as recited in claim 13, wherein said pivotable jaw is an "L" shaped member pivoted at its short end and engaged by a jaw actuator member at its long end.

18. The apparatus as recited in claim 17, wherein said jaw actuator member advances said pivotable jaws long end which pivots said pivotable jaws short end into a corner of the lid with a resulting mechanical advantage to apply a secure grip on opposite diagonal corners of the lid between said movable slide jaw at one corner of the lid and said pivotable jaw at the opposite diagonal corner of the lid.

19. The apparatus as recited in claim 13, wherein said jaw actuator member pivots said pivotable jaw with respect to a corner of the lid with a resulting mechanical advantage so as to apply a secure grip on opposite diagonal corners of the lid between said movable slide jaw at one corner of the lid and said pivotable jaw at the opposite diagonal corner of the lid.

20. The apparatus as recited in claim 13 further comprising a frame for holding said first set of jaws, said means for gripping the lid and said means for pivoting the means for gripping the lid.

21. A method of separating a bonded lid from a substrate comprising the steps of:
    providing an apparatus comprising a first set of jaws for holding the substrate and a second set of jaws for gripping a lid bonded to the substrate, said second set of jaws for gripping comprising a movable slide jaw having a protruding lip ending in a sharp edge and a pivotable jaw having a protruding lip ending in a sharp edge;
    placing the substrate with the bonded lid in said apparatus; and
    pivoting said second set of jaws with respect to said first set of jaws so as to separate the lid from the substrate.

22. The method of claim 21 wherein each jaw of said first set of jaws has a protruding lip, and wherein said first set of jaws are positioned adjacent to each edge of the substrate and support the substrate with the protruding lip.

23. The method of claim 21 further including the step of securing a substrate of variable size by positioning at least one jaw in said first set of jaws with a retaining screw positioned in a clearance slot in said at least one jaw, said at least one jaw being slideably moveable over the length of said clearance slot.

24. The method of claim 23 further including the steps of:
    providing a coarse jaw adjust member; and
    positioning said movable slide jaw with said coarse jaw adjust member to contact and advance said movable slide jaw into contact with a corner of the lid and advance the pivotable jaw into contact with the lid on the lid's opposite diagonal comet.

25. The method of claim 23 further including the steps of:
    providing a jacking member for said apparatus communicating with said second set of jaws; and
    activating said jacking member to cause said second set of jaws to pivot with respect to said first set of jaws resulting in a peeling force which initiates the separation of the lid from the substrate.

26. The method of claim 21 wherein said first set of jaws comprises four jaws of which two jaws are moveable and two jaws are fixed.

27. The method of claim 21, wherein said pivotable jaw pivots around a pivot point and has an end opposite from the protruding lip, the end engaged by a jaw actuator member.

28. The method of claim 21, wherein said pivotable jaw is an "L" shaped member pivoted at its short end and engaged by a jaw actuator member at its long end.

29. The method of claim 28 further including the steps of:
    communicating said jaw actuator member with said pivotable jaws long end; and
    activating said jaw actuator member to cause said pivotable jaw to pivot said pivotable jaws short end into a corner of the lid with a resulting mechanical advantage to apply a secure grip on opposite diagonal corners of the lid between said movable slide jaw at one corner of the lid and said pivotable jaw at the opposite diagonal corner of the lid.

* * * * *